United States Patent
Oshima

(10) Patent No.: US 9,466,655 B2
(45) Date of Patent: Oct. 11, 2016

(54) DISPLAY UNIT AND ELECTRONIC APPARATUS

(71) Applicant: JOLED Inc., Tokyo (JP)

(72) Inventor: Yoshihiro Oshima, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 14/739,558

(22) Filed: Jun. 15, 2015

(65) Prior Publication Data

US 2016/0104759 A1   Apr. 14, 2016

(30) Foreign Application Priority Data

Oct. 10, 2014 (JP) ................................. 2014-208526

(51) Int. Cl.
    *H01L 27/32*    (2006.01)
(52) U.S. Cl.
    CPC ....... *H01L 27/3276* (2013.01); *H01L 27/3248* (2013.01); *H01L 27/3262* (2013.01); *H01L 27/3272* (2013.01)
(58) Field of Classification Search
    CPC ........... H01L 27/3276; H01L 27/3248; H01L 27/3262; H01L 27/3272
    See application file for complete search history.

(56) References Cited

U.S. PATENT DOCUMENTS

| 2013/0153893 A1* | 6/2013 | Morosawa | .......... H01L 27/1225 257/43 |
| 2013/0221358 A1* | 8/2013 | Morosawa | ........ H01L 29/66742 257/59 |
| 2015/0279871 A1* | 10/2015 | Morosawa | .......... H01L 27/1225 257/43 |
| 2015/0279907 A1* | 10/2015 | Sato | ...................... H01L 27/326 257/40 |

FOREIGN PATENT DOCUMENTS

JP         2004-235078 A         8/2004

* cited by examiner

*Primary Examiner* — Mamadou Diallo
(74) *Attorney, Agent, or Firm* — Michael Best & Friedrich LLP

(57) ABSTRACT

A display unit includes: a drive substrate including a thin film transistor; a pixel section provided on the drive substrate and including a plurality of pixels, each of the pixels including a first electrode, an organic layer including a light-emitting layer, and a second electrode in this order; and a connection section provided in a peripheral region around the pixel section in the drive substrate and configured to be electrically connected to the second electrode, in which the connection section includes an oxide semiconductor layer including, in at least a portion on a surface side thereof, a low-resistance region with lower electrical resistance than that in a portion other than the low-resistance region.

11 Claims, 9 Drawing Sheets

DISPLAY UNIT AND ELECTRONIC APPARATUS

CROSS REFERENCE TO RELATED APPLICATIONS

This application claims the benefit of Japanese Priority Patent Application JP 2014-208526 filed Oct. 10, 2014, the entire contents of each which is incorporated herein by reference.

BACKGROUND

The present disclosure relates to a display unit such as an organic electroluminescence unit and an electronic apparatus including such a display unit.

In recent years, development of display units (organic electroluminescence (EL) displays) using an organic EL device has been advanced. The display units are broadly divided into a top emission system and a bottom emission system.

In a top emission organic EL display unit, as an electrode (an upper electrode) where light is extracted, a transparent conductive film configured of a metal oxide film such as indium tin oxide (ITO) is typically used. Moreover, in order to connect the upper electrode to an external circuit or the like, a wiring connection section (a connection section) is provided as a so-called cathode contact in a predetermined region of a drive substrate including a pixel circuit. The upper electrode is so formed as to establish interlayer connection with the connection section, and a lead wire configured to connect the connection section and the external circuit or the like to each other is provided in the drive substrate.

However, the above-described transparent conductive film is typically formed with use of a physical vapor deposition (PVD) method such as a sputtering method. Therefore, the connection section is easily oxidized by oxygen or oxygen plasma during film formation. Consequently, it is difficult to use, for the connection section, a metal that exhibits insulation properties in oxide form. More specifically, it is difficult for aluminum (Al), an alloy (Al—Nd alloy) of aluminum and neodymium (Nd), or the like to function as an electrode, since contact resistance thereof is increased by oxidation.

Therefore, as the connection section, a connection section configured by laminating a metal film made of molybdenum, titanium, or the like on a surface of an Al—Nd alloy (or aluminum) is used. Since titanium and molybdenum exhibit electrical conductivity even in oxidized form, the connection section is allowed to secure electrical connection with the upper electrode. However, the connection section may be eroded during etching of another electrode or the like, and the connection section may not secure sufficient electrical connection accordingly. Moreover, when a substrate size is increased, or when in-plane uniformity in etching processing is degraded, electrical connection may not be secured. This exerts a large influence on a lighting state.

In view of the above, for example, in Japanese Unexamined Patent Application Publication No. 2004-235078, there has been proposed a technique of decreasing resistance of an upper electrode (a transparent conductive film) by bringing a metal wire and the upper electrode into contact with each other, and then performing heating treatment. Thus, contact resistance between the upper electrode and the connection section is allowed to be reduced, thereby obtaining electrical connection therebetween.

SUMMARY

However, in the top emission organic EL display unit, it is desirable to achieve, as a novel electrode lead-out configuration, a configuration that is less likely to be influenced by etching of a metal film or the like and is able to secure favorable electrical connection between a connection section and an upper electrode.

It is desirable to provide a display unit and an electronic apparatus each of which is able to secure favorable electrical connection in a wiring connection section.

According to an embodiment of the present disclosure, there is provided a display unit including: a drive substrate including a thin film transistor; a pixel section provided on the drive substrate and including a plurality of pixels, each of the pixels including a first electrode, an organic layer including a light-emitting layer, and a second electrode in this order; and a connection section provided in a peripheral region around the pixel section in the drive substrate and configured to be electrically connected to the second electrode, in which the connection section includes an oxide semiconductor layer including, in at least a portion on a surface side thereof, a low-resistance region with lower electrical resistance than that in a portion other than the low-resistance region.

According to an embodiment of the present disclosure, there is provided an electronic apparatus provided with a display unit, the display unit including: a drive substrate including a thin film transistor; a pixel section provided on the drive substrate and including a plurality of pixels, each of the pixels including a first electrode, an organic layer including a light-emitting layer, and a second electrode in this order; and a connection section provided in a peripheral region around the pixel section in the drive substrate and configured to be electrically connected to the second electrode, in which the connection section includes an oxide semiconductor layer including, in at least a portion on a surface side thereof, a low-resistance region with lower electrical resistance than that in a portion other than the low-resistance region.

In the display unit and the electronic apparatus according to the embodiments of the present disclosure, the connection section provided in the drive substrate includes the oxide semiconductor layer; therefore, compared to a case where the connection section is made of a metal, the connection section is resistant to damage during processing of a metal film in a later process. Moreover, an increase in contact resistance due to oxidation of a metal (due to a metal oxide) is less likely to occur. Such a connection section includes the low-resistance region in at least the portion on the surface side thereof; therefore, contact resistance between the second electrode and the connection section is reduced.

In the display unit and the electronic apparatus according to the embodiments of the present disclosure, the connection section provided in the drive substrate includes the oxide semiconductor layer; therefore, compared to the case where the connection section is made of the metal, damage in a manufacturing procedure is allowed to be reduced, and an increase in contact resistance is allowed to be suppressed. Moreover, the low-resistance region is included in at least the portion on the surface side of the connection section; therefore, contact resistance between the second electrode and the connection section is allowed to be reduced. For example, favorable electrical connection with an external circuit through the connection section is possible. Therefore, favorable electrical connection is allowed to be secured in a wiring connection section.

It is to be noted that the above description is merely an example of the embodiments of the present disclosure. Effects of the embodiments of the present disclosure are not limited to effects described here, and may be different from the effects described here or may further include any other effect.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

DETAILED DESCRIPTION

Some embodiments of the present technology will be described in detail below referring to the accompanying drawings. It is to be noted that description will be given in the following order.
1. Embodiment (An example of a display unit that uses an oxide semiconductor layer including a low-resistance region for a connection section)
2. Application Examples (Examples of electronic apparatuses)

Embodiment

Configuration

Figure 1A:
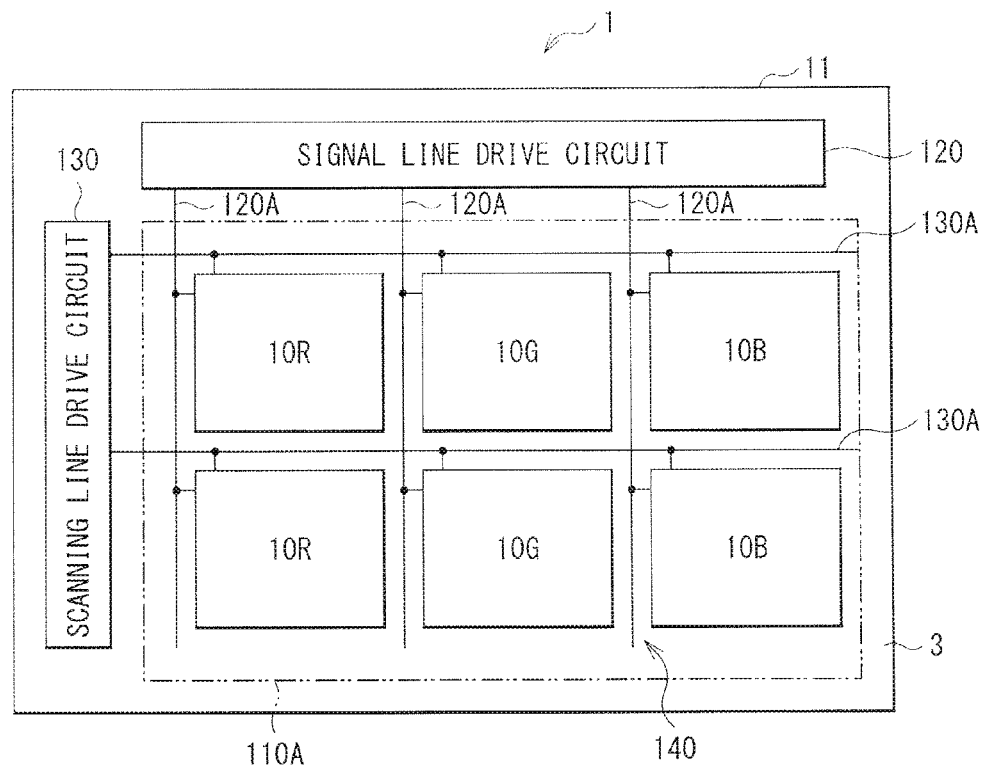
FIG. 1A is a diagram illustrating a configuration of a display unit according to a first embodiment of the present disclosure.

FIG. 1A illustrates a configuration of a display unit (a display unit 1) according to an embodiment of the present disclosure. The display unit 1 is an organic EL display in which a plurality of pixels 10R, 10G, and 10B each including an organic EL device 10 are arranged in a matrix in a display region 110A on a substrate 11. The pixels 10R, 10G, and 10B emit red light (with a wavelength of about 620 nm to about 750 nm), green light (with a wavelength of about 495 nm to about 570 nm), and blue light (with a wavelength of about 450 nm to about 495 nm), respectively. The pixels 10R, 10G, and 10B correspond to sub-pixels (an R pixel, a G pixel, and a B pixel, respectively). For example, an image may be displayed using a combination of one R pixel, one G pixel, and one B pixel as one pixel. A signal line drive circuit 120 and a scanning line drive circuit 130 for image display are provided around the display region 110A.

Figure 1B:
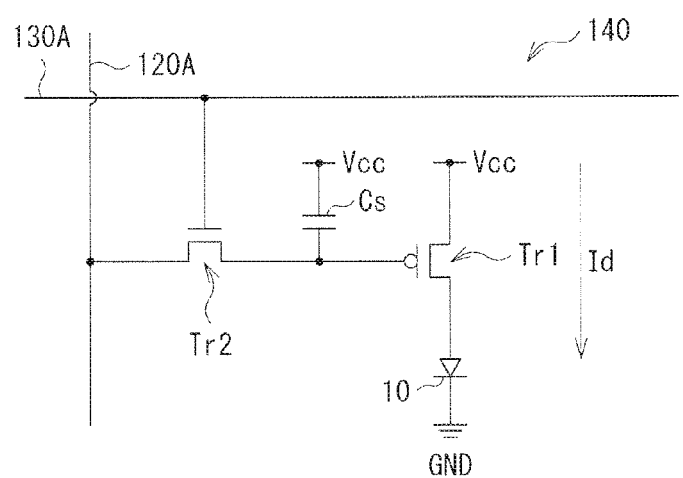
FIG. 1B is a circuit diagram illustrating an example of a pixel circuit illustrated in FIG. 1.

For example, an active drive circuit (a pixel circuit 140) may be provided in the display region 110A. As illustrated in FIG. 1B, the pixel circuit 140 includes a driving transistor Tr1 and a writing transistor Tr2, and a retention capacitor Cs is provided between the transistors Tr1 and Tr2. The organic EL device 10 is connected in series to the transistor Tr1 between a first power supply line (Vcc) and a second power supply line (GND). The signal line drive circuit 120 supplies image signals to source electrodes of the transistors Tr2 through a plurality of signal lines 120A arranged along a column direction. The scanning line drive circuit 130 sequentially supplies scanning signals to gate electrodes of the transistors Tr2 through a plurality of scanning line 130A arranged along a row direction.

Figure 2:
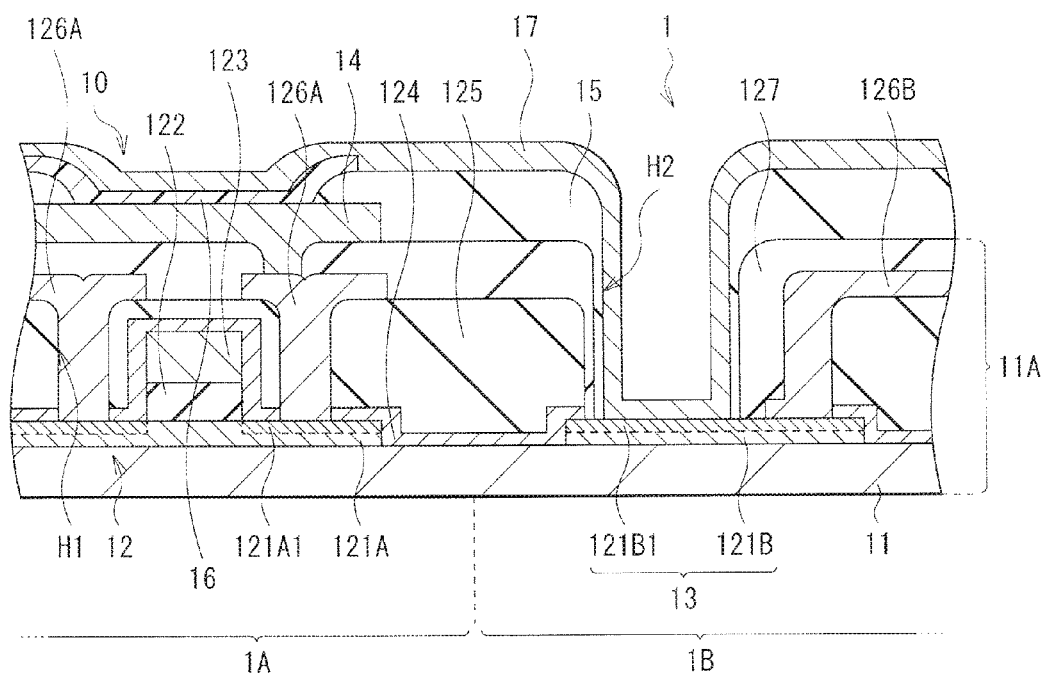
FIG. 2 is a sectional view illustrating a main-part configuration of the display unit illustrated in FIG. 1.

FIG. 2 illustrates a main-part sectional configuration of the display unit 1 illustrated in FIG. 1A. It is to be noted that FIG. 2 illustrates a configuration around a boundary between a pixel section 1A (corresponding to the display region 110A in FIG. 1) including a plurality of pixels each of which includes the organic EL device 10 and a peripheral region 1B. The organic EL device 10 includes a first electrode 14, an organic layer 16, and a second electrode 17 in this order on a drive substrate 11A. A sealing substrate is bonded onto the organic EL devices 10 with an unillustrated protective layer and an unillustrated adhesive layer in between. The display unit 1 may be a so-called top emission organic EL display in which light generated in the organic layer 16 is extracted from the second electrode 17.

The drive substrate 11A is configured by forming the pixel circuit 140 including a TFT 12 (for example, corresponding to the transistor Tr1 in FIG. 1B) in the pixel section 1A on the substrate 11. A connection section 13 as a so-called cathode contact is provided in the peripheral region 1B of the drive substrate 11A. A surface of the drive substrate 11A is covered with a planarization film 127.

The substrate 11 may be configured of, for example, glass, a silicon (Si) wafer, a resin, or a conductive substrate. As the conductive substrate, for example, a substrate with a surface insulated with silicon oxide ($SiO_2$), a resin, or the like may be used.

The TFT 12 is a so-called top gate thin film transistor (TFT). The TFT 12 may be configured of, for example, a MOSFET (Metal Oxide Semiconductor Field Effect Transistor). The TFT 12 may include, for example, an oxide semiconductor layer 121A forming an active layer (a channel) in a predetermined region on the substrate 11. In the TFT 12, a gate electrode 123 is provided in a selective region on the oxide semiconductor layer 121A with a gate insulating film 122 in between. The oxide semiconductor layer 121A includes a low-resistance region 121A1 in a region not facing the gate electrode 123 (a region facing a source-drain electrode 126A). An interlayer insulating film 125 is formed on the oxide semiconductor layer 121A. The interlayer insulating film 125 has a contact hole H that is so provided as to face the low-resistance region 121A1, and the source-drain electrode 126A is so formed on the interlayer insulating film 125 as to be embedded in the contact hole H1. Therefore, the source-drain electrode 126A is electrically connected to the oxide semiconductor layer 121A (is in contact with the low-resistance region 121A1) through the contact hole H1. The source-drain electrode 126A functions as a source electrode or a drain electrode, and one electrode (for example, the drain electrode) is electrically connected to the first electrode 14 of the organic EL device 10. It is to be noted that the TFT 12 is not limited to such a top gate TFT, and may be a bottom gate TFT. Moreover, the TFT 12 is not limited to a TFT using an oxide semiconductor, and may be configured of a semiconductor other than the oxide semiconductor, for example, polycrystalline silicon, amorphous silicon, or the like.

The connection section 13 is electrically connected to the second electrode 17 of the organic EL device 10, and is a wiring connection section for interlayer connection between the second electrode 17 and a wiring layer 126B formed in the drive substrate 11A. A contact hole H2 is formed in regions corresponding to the connection section 13 of the interlayer insulating film 125, the planarization film 127, and the insulating film 15.

The wiring layer 126B is a lead wire for connection to an external circuit. The wiring layer 126B may include a metal such as molybdenum (Mo), titanium (Ti), and aluminum (Al), and may be configured of, for example, a laminated film of these metals (Mo/Al/Ti). When Mo or Ti is formed on a surface side of the wiring layer 126B, insulation (an increase in resistance) due to oxidation is allowed to be suppressed. The wiring layer 126B may be made of, for example, the same material as that of the source-drain electrode 126A of the TFT 12, and is allowed to be collectively formed in the same process as a process of forming the source-drain electrode 126A. The wiring layer 126B is laminated on a portion of the connection section 13 (is in contact with the portion of the connection section 13), and is so formed as to extend (be drawn) to a region connectable to the external circuit. The wiring layer 126B is covered with the planarization film 127, and is less likely to be exposed to a wet etchant during processing of a metal film (for example, a metal film 126 that will be described later) formed thereon.

The connection section 13 includes an oxide semiconductor layer 121B. The oxide semiconductor layer 121B includes, in at least a portion on a surface side thereof, a low-resistance region 121B1 with lower electrical resistance than that in a portion other than the low-resistance region 121B1. As will be described later, the low-resistance region 121B1 is formed by contact with a metal film 124a and heating treatment. The oxide semiconductor layer 121B may be made of, for example, the same material (that will be described later) as that of the oxide semiconductor layer 121A of the TFT 12. The oxide semiconductor layers 121A and 121B are allowed to be collectively formed on the substrate 11 in a same process. Moreover, the low-resistance region 121B1 and the low-resistance region 121A1 of the oxide semiconductor layer 121A are allowed to be collectively formed in a same process.

The oxide semiconductor layers 121A and 121B may include, for example, one or more metals such as indium (In), zinc (Zn), gallium (Ga), tin (Sn), titanium (Ti), and aluminum (Al), and oxygen (O). The oxide semiconductor layers 121A and 121B may be preferably made of a material resistant to an etchant for processing of a metal film (such as an electrode or a wiring line (for example, the metal film 126 that will be described later)) formed above the oxide semiconductor layers 121A and 121B. Examples of an oxide semiconductor resistant to an etchant for processing of aluminum and molybdenum (for example, phosphoric-nitric-acetic acid (a solution prepared by mixing phosphoric acid, nitric acid, and acetic acid)) may include ITO (indium tin oxide), IZO (indium zinc oxide) and ITZO (a compound containing indium, tin, zinc, and oxygen). When the oxide semiconductor is thus used for the connection section 13, the composition of the oxide semiconductor is similar to that of the material of the second electrode 17, and contact resistance between the connection section 13 and the second electrode 17 is allowed to be reduced. It is to be noted that in this embodiment, a case where the oxide semiconductor layers 121A and 121B are made of the same material is described as an example; however, the oxide semiconductor layer 121A and the oxide semiconductor layer 121B may be made of different oxide semiconductors.

A metal oxide film 124 is so formed as to cover a part of the TFT 12 and a part of the connection section 13. More specifically, the metal oxide film 124 covers a part of the oxide semiconductor layer 121A, a side surface of the gate insulating film 122, a side surface and a top surface of the gate electrode 123, and a part of the oxide semiconductor layer 121B. Moreover, the metal oxide film 124 is so formed as to cover a portion that is not in contact with the second electrode 17 of the oxide semiconductor layer 121B (herein, a portion in proximity to a side surface of the oxide semiconductor layer 121B). The metal oxide film 124 is configured by oxidizing a metal film (the metal film 124a that will be described later) used to form the low-resistance regions 121A1 and 121B1. The metal oxide film 124 may be made of, for example, an oxide of aluminum (Al), titanium (Ti), molybdenum (Mo), or indium (In). Preferably, the metal oxide film 124 may include aluminum oxide ($Al_2O_3$). In other words, aluminum may be preferably used as the metal film used to form the low-resistance regions 121A1 and 121B1 in a manufacturing process.

The metal oxide film 124 may preferably have insulation properties. For example, in a case where the metal oxide film 124 is made of aluminum oxide, since the metal oxide film 124 exhibits insulation properties, the metal oxide film 124 is selectively removed in a region corresponding to the contact hole H1 on a top surface of the oxide semiconductor layer 121A. Moreover, the metal oxide film 124 is selectively removed in a region including a contact portion between the contact hole H2 and the wiring layer 126B on a top surface of the oxide semiconductor layer 121B. In a case where the metal oxide film 124 exhibits electrical conductivity, the metal oxide film 124 may cover the entire top surfaces of the oxide semiconductor layers 121A and 121B. However, in this case, the source-drain electrode 126A and the gate electrode 123 are electrically connected to each other. Therefore, in order to electrically isolate the source-drain electrode 126A and the gate electrode 123 from each other, a process of selectively removing a part of the metal oxide film 124 may be preferably performed.

The first electrode 14 is provided for each pixel, and may function as an electrode configured to inject holes to the organic layer 16. The first electrode 14 has light reflectivity, and may preferably have as high reflectivity as possible in order to enhance light emission efficiency. Examples of a material of such a first electrode 14 may include a simple substance and an alloy of a metal element such as silver (Ag), aluminum (Al), molybdenum (Mo), or chromium (Cr). Moreover, the first electrode 14 may be a single-layer film or a laminated film including the above-described simple substance or alloy of the metal.

The organic layer 16 includes a light-emitting layer (an organic EL layer), and may further include, for example, a hole transport layer (HTL), a hole injection layer (HIL), and an electron transport layer (ETL). The organic layer 16 is formed in the entire display region 110A of the substrate 11 (the organic layer 16 is so formed as to be shared by the pixels 10R, 10G, and 10G), and may has a configuration (a tandem configuration) in which a plurality of light-emitting units are laminated. Examples of the tandem configuration may include a configuration in which a blue light-emitting layer and a yellow light-emitting layer are laminated, and a configuration in which a red light-emitting layer, a green light-emitting layer, and a blue light-emitting layer are laminated. In this case, white light emitted from each of the organic EL devices 10 passes through a color filter provided on an unillustrated sealing substrate, thereby being emitted as red light, green light, blue light, or the like. However, the organic layer 16 may include light-emitting layers of colors different for respective pixels (single-color light-emitting layers) (the light-emitting layer may be color-coded for each pixel).

The second electrode 17 has light transparency, and may be so formed on the entire display region 110A as to be shared by, for example, all of the pixels 10R, 10G, and 10B. The second electrode 17 may be, for example, a transparent conductive film made of an oxide semiconductor such as ITO or IZO. Moreover, a material that is the same as or different from that of the above-described oxide semiconductor layers 121A and 121B may be used for the second electrode 17. Further, a simple substance or an alloy of a metal element such as aluminum (Al), copper (Cu), magnesium (Mg), or silver (Ag) may be used for the second electrode 17. The second electrode 17 may be electrically connected to the connection section 13 in, for example, the peripheral region 1B. More specifically, the second electrode 17 is so formed as to be in contact with the connection section 13 through the contact hole H2 provided in the peripheral region 1B.

Manufacturing Method

The above-described display unit 1 may be manufactured by, for example, the following processes. FIGS. 3A to 11 are schematic views for describing the method of manufacturing the display unit 1 according to this embodiment.

Formation of Drive Substrate 11A

Figure 3A:
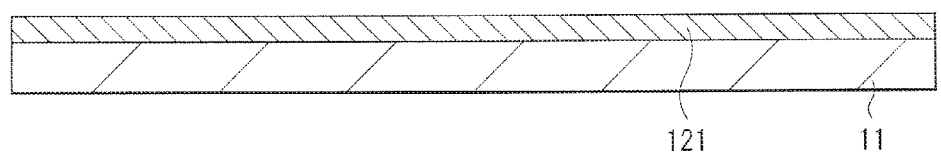
FIG. 3A is a sectional view for describing a method of manufacturing the display unit illustrated in FIG. 2.
Figure 3B:
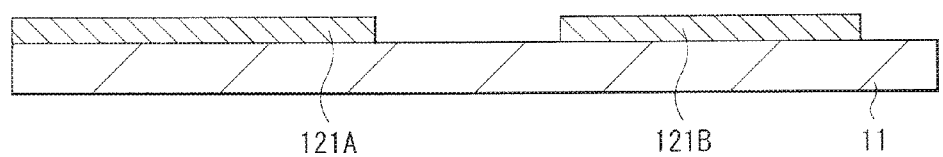
FIG. 3B is a sectional view illustrating a process following FIG. 3A.

First, the drive substrate 11A including the TFT 12 is formed. More specifically, first, as illustrated in FIG. 3A, the oxide semiconductor layer 121 made of the above-described material is formed on the substrate 11. Examples of a film formation method may include a physical vapor deposition (PVD) method such as a sputtering method, an evaporation method, and a pulsed laser deposition (PLD) method. In addition thereto, a wet coating method such as a spray coating method or a slit coating method may be used. Thereafter, as illustrated in FIG. 3B, patterning is performed on the oxide semiconductor layer 121 by, for example, wet etching or dry etching using a photolithography method to form the oxide semiconductor layers 121A and 121B. Thus, the oxide semiconductor layer 121A of the TFT 12 and the oxide semiconductor layer 121B of the connection section 13 are allowed to be collectively formed in, for example, a same process.

Figure 3C:
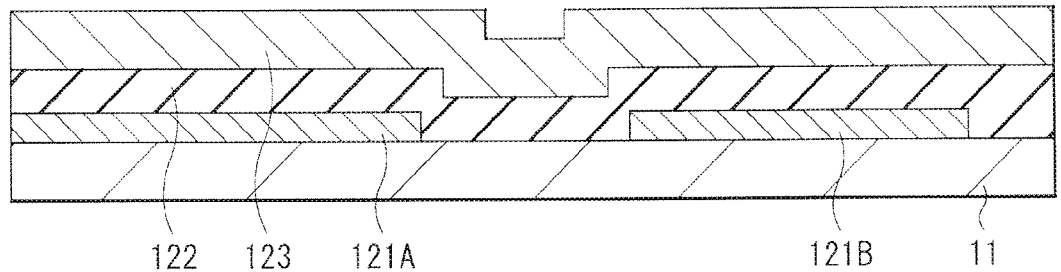
FIG. 3C is a sectional view illustrating a process following FIG. 3B.
Figure 3D:
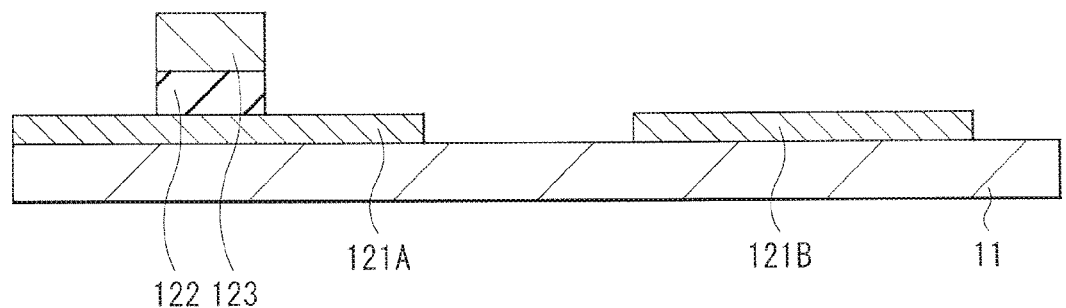
FIG. 3D is a sectional view illustrating a process following FIG. 3C.

Subsequently, as illustrated in FIG. 3C, the gate insulating film 122 and the gate electrode 123 are formed in this order on the entire surface of the substrate 11. Thereafter, as illustrated in FIG. 3D, patterning is performed on the gate insulating film 122 and the gate electrode 123 by, for example, etching using a photolithography method. More specifically, patterning is performed so as to leave the gate insulating film 122 and the gate electrode 123 in a selective region on the oxide semiconductor layer 121A.

Figure 4A:
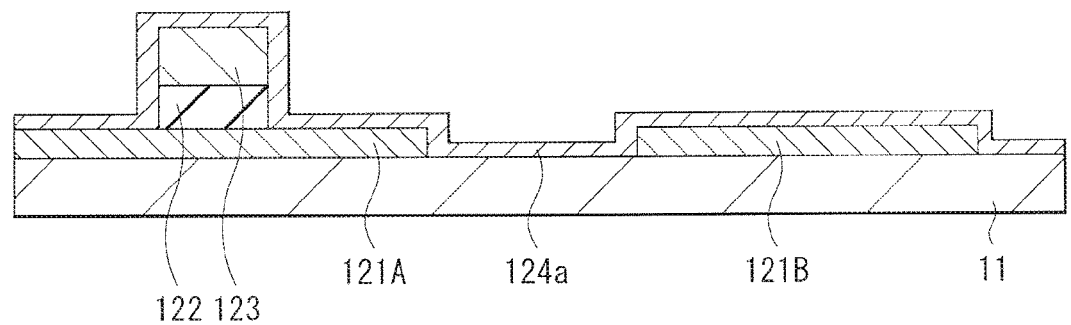
FIG. 4A is a sectional view illustrating a process following FIG. 3D.
Figure 4B:
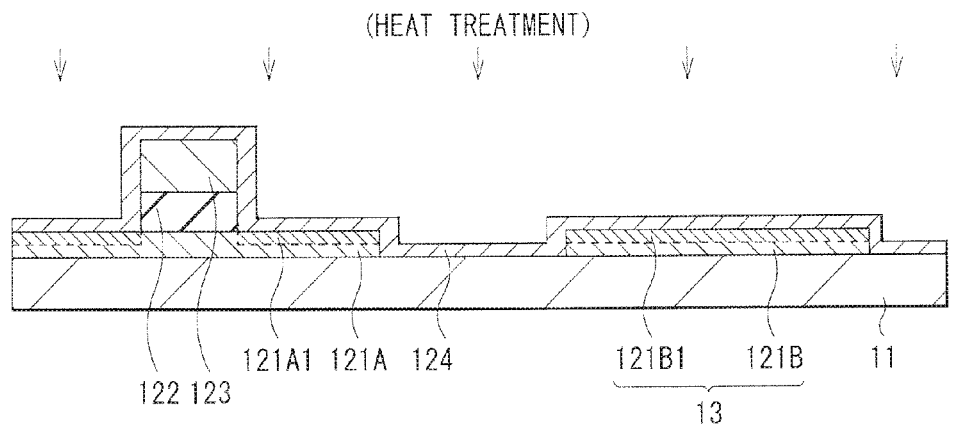
FIG. 4B is a sectional view illustrating a process following FIG. 4A.

Subsequently, the low-resistance regions 121A1 and 121B1 are formed in the oxide semiconductor layers 121A and 121B, respectively. More specifically, first, as illustrated in FIG. 4A, the metal film 124a made of, for example, aluminum or the like is formed by, for example, a sputtering method, an evaporation method, or the like to cover the oxide semiconductor layers 121A and 121B, the gate insulating film 122, and the gate electrode 123. Subsequently, as illustrated in FIG. 4B, heat treatment is performed. The heat treatment is performed in a state in which the metal film 124a is in contact with the surfaces of the oxide semiconductor layers 121A and 121B, thereby decreasing resistance of regions in proximity to contact surfaces with the metal film 124a of the oxide semiconductor layers 121A and 121B (forming the low-resistance regions 121A1 and 121B1), and oxidizing the metal film 124a (forming the metal oxide film 124). The connection section 13 is formed in the peripheral region 1B.

Figure 5:
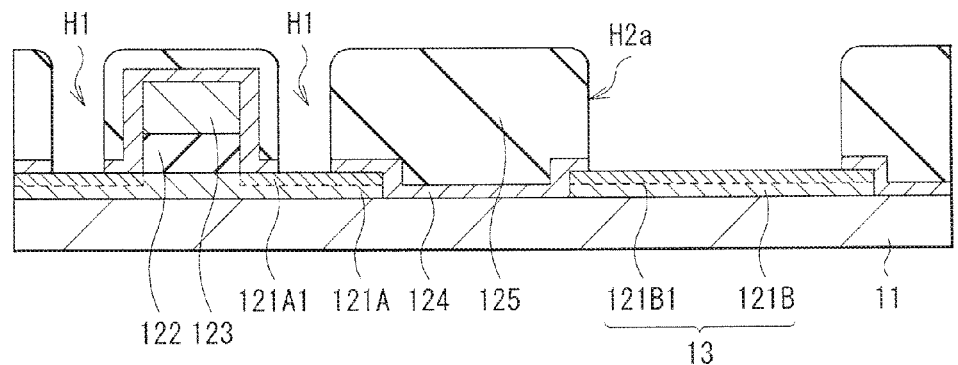
FIG. 5 is a sectional view illustrating a process following FIG. 4B.

Thereafter, as illustrated in FIG. 5, the interlayer insulating film 125 is formed. At this time, the contact hole H1 and a contact hole H2a are formed in a selective region on the oxide semiconductor layer 121A and a selective region on the oxide semiconductor layer 121B, respectively. It is to be noted that, although not illustrated, the low-resistance regions 121A1 and 121B1 are exposed by selectively etching portions corresponding to the contact holes H1 and H2a of the metal oxide film 124.

Figure 6A:
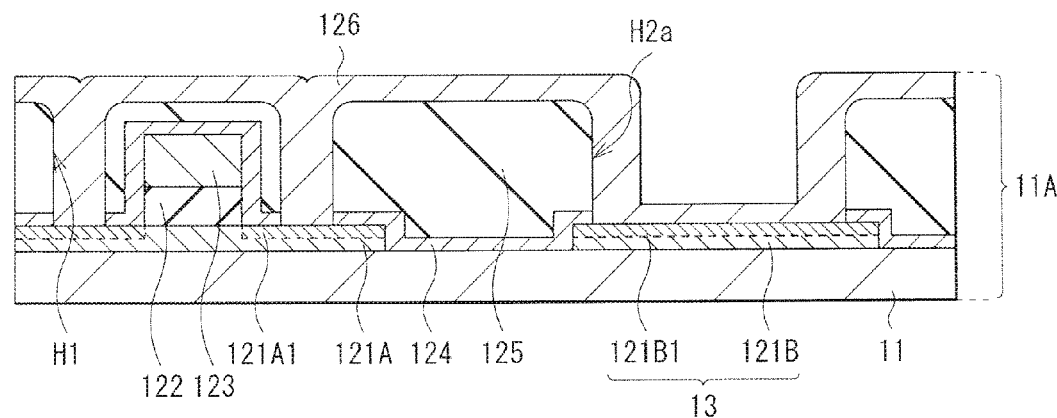
FIG. 6A is a sectional view illustrating a process following FIG. 5.
Figure 6B:
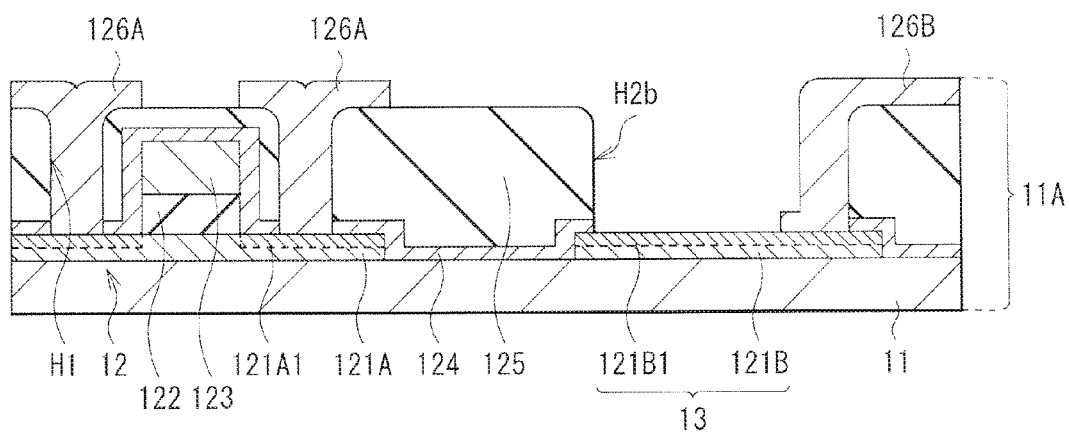
FIG. 6B is a sectional view illustrating a process following FIG. 6A.

Subsequently, the source-drain electrode 126A and the wiring layer 126B are formed. More specifically, first, as illustrated in FIG. 6A, the metal film 126 configured of the above-described laminated film (Mo/Ti/Al or the like) is formed on the entire surface of the substrate 11. Thereafter, as illustrated in FIG. 6B, patterning is performed on the metal film 126 by, for example, etching using a photolithography method to form the source-drain electrode 126A and the wiring layer 126B. At this time, a contact hole H2b is formed by selectively removing a portion on the connection section 13 of the metal film 126. Since the oxide semiconductor layer 121B is made of a material resistant to an etchant of the metal film 126, the low-resistance region 121B1 is resistant to damage during processing of the metal film 126 (during formation of the source-drain electrode 126A and the wiring layer 126B), and an increase in contact resistance with the second electrode 17 is allowed to be suppressed.

Figure 7:
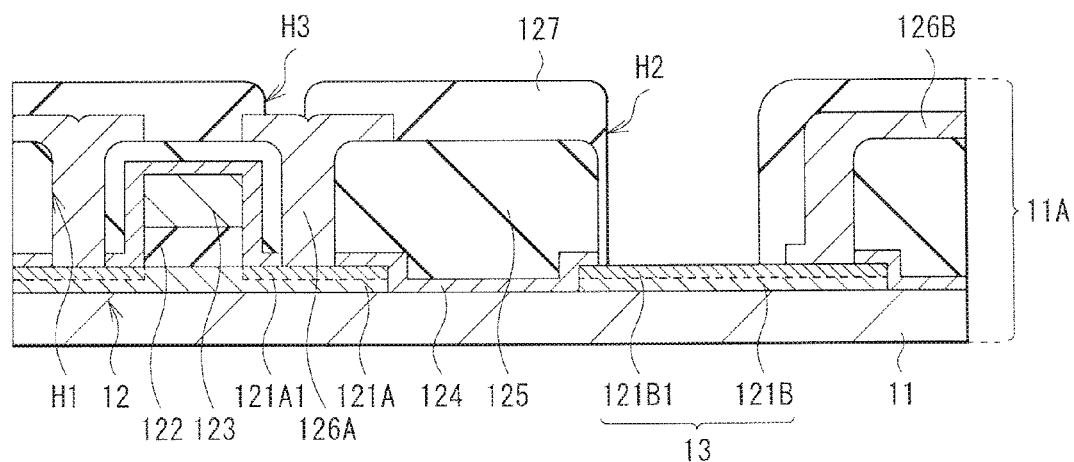
FIG. 7 is a sectional view illustrating a process following FIG. 6B.

Subsequently, as illustrated in FIG. 7, the planarization film 127 is formed. At this time, a contact hole H3 is formed on one of a pair of the source-drain electrodes 126A. Moreover, an opening is formed on the connection section 13 to form the contact hole H2b. Thus, the drive substrate 11A is formed.

Figure 8A:
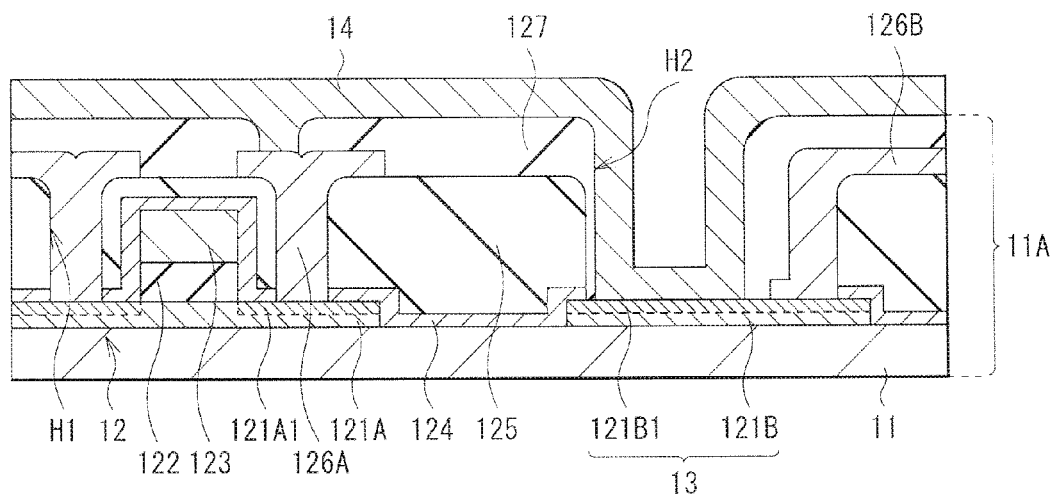
FIG. 8A is a sectional view illustrating a process following FIG. 7.
Figure 8B:
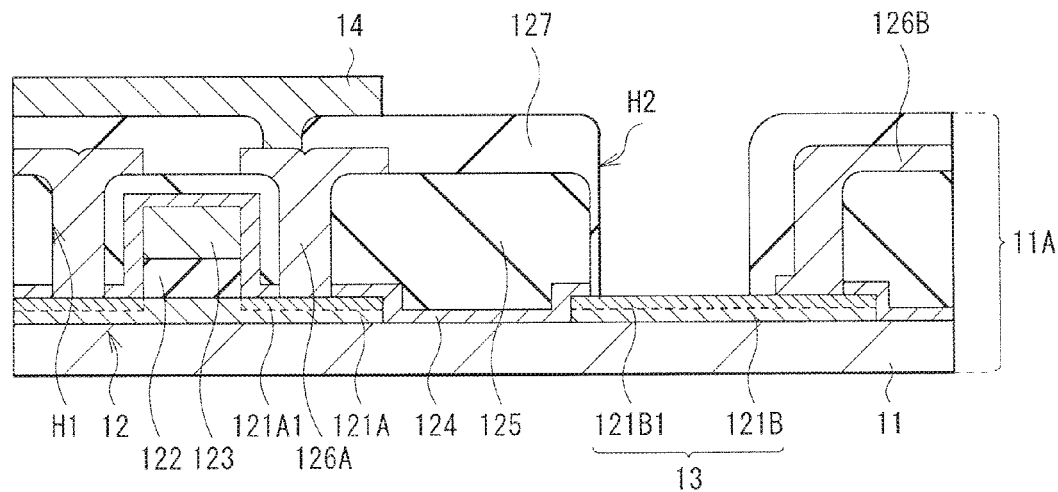
FIG. 8B is a sectional view illustrating a process following FIG. 8A.

Thereafter, the first electrode 14 is formed. More specifically, first, as illustrated in FIG. 8A, the first electrode 14 made of the above-described material is formed on the planarization film 127 of the drive substrate 11A on the entire surface of the substrate 11 by, for example, an evaporation method, a sputtering method, or the like. Thereafter, as illustrated in FIG. 8B, patterning is performed for each pixel by, for example, etching using a photolithography method. Thus, the first electrode 14 is formed. The first electrode 14 is electrically connected to the TFT 12 through the contact hole H3.

Figure 9:
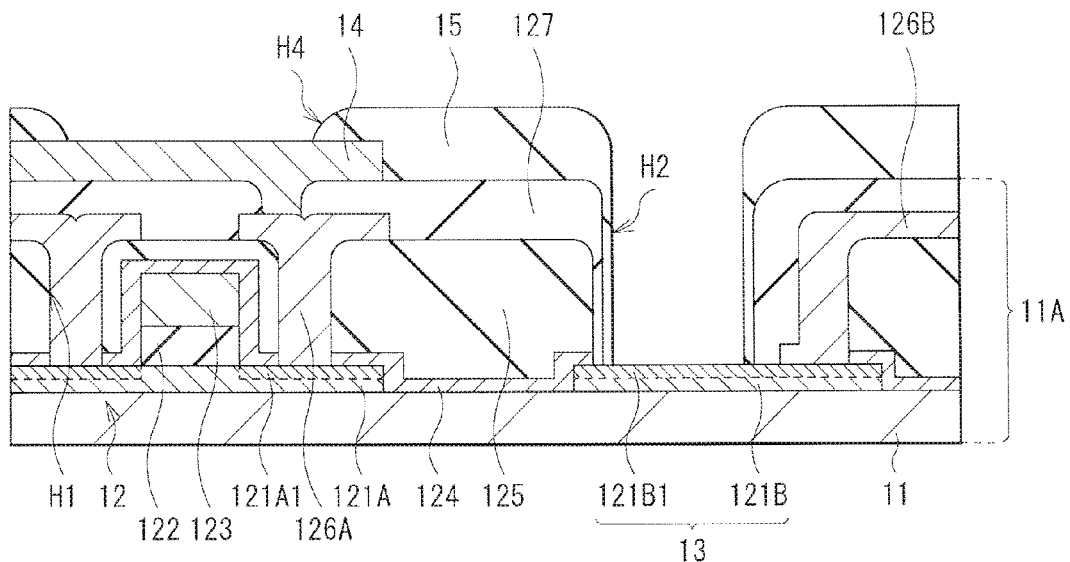
FIG. 9 is a sectional view illustrating a process following FIG. 8B.

Subsequently, as illustrated in FIG. 9, the insulating film 15 is formed. At this time, an opening H4 is so formed as to face the first electrode 14, and the contact hole H2 is formed by selectively removing a portion on the connection section 13 of the insulating film 15.

Figure 10:
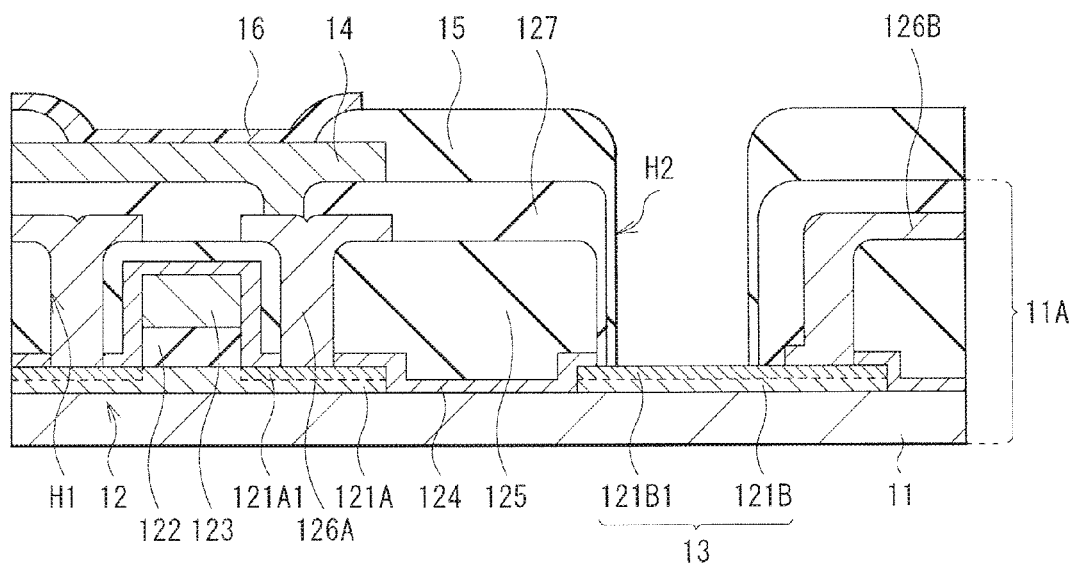
FIG. 10 is a sectional view illustrating a process following FIG. 9.

Subsequently, as illustrated in FIG. 10, the organic layer 16 is formed. More specifically, films of organic materials are successively formed (deposited) in the pixel section 1A with use of a predetermined mask by, for example, a vapor deposition method.

Figure 11:
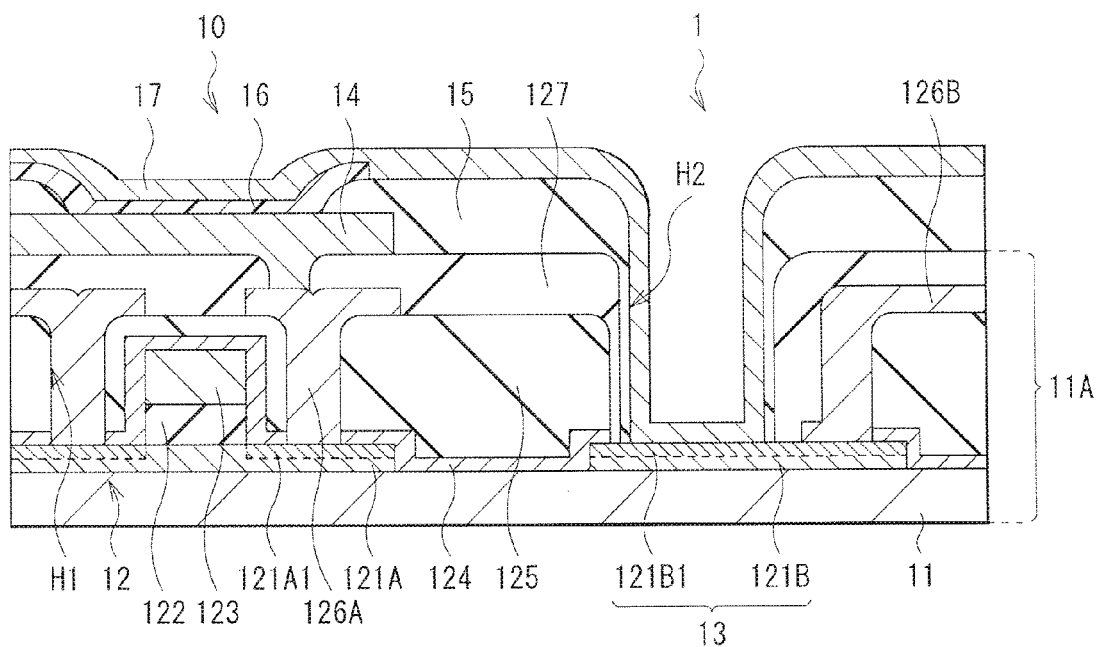
FIG. 11 is a sectional view illustrating a process following FIG. 10.

Thereafter, as illustrated in FIG. 11, the second electrode 17 made of the above-described material is formed with use of, for example, a sputtering method or an evaporation method. Thus, the second electrode 17 is so formed as to be in contact with the connection section 13 through the contact hole H2 in the peripheral region 1B. The connection section 13 includes the oxide semiconductor layer 121B, and includes the low-resistance region 121B1 in at least a portion on the surface side thereof; therefore, contact resistance between the second electrode 17 and the connection section 13 is reduced to obtain favorable electrical connection.

Finally, although not illustrated, the sealing substrate is bonded onto the second electrode 17 with the protective layer and the adhesive layer in between. Thus, the display unit 1 illustrated in FIG. 2 is completed.

Functions and Effects

In the display unit 1, as illustrated in FIGS. 1A and 1B, the scanning signal is supplied from the scanning line drive circuit 130 to the gate of the transistor Tr2 of each of the pixels 10R, 10G, and 10B, and the image signal is supplied from the signal line drive circuit 120 to the retention capacitor Cs through the transistor Tr2 to be retained in the retention capacitor Cs. On-off control of the transistor Tr1 (the TFT 12) is performed in response to the signal retained in the retention capacitor Cs, and a drive current Id is thereby injected into the organic EL device 10 of each of the pixels 10R, 10G, and 10B. When the drive current Id is injected into the light-emitting layer of the organic layer 16 through the first electrode 14 and the second electrode 17, holes and electrons are recombined to cause light emission.

When, for example, white light is emitted from each of the organic EL devices 10, the white light passes through the second electrode 17 and the like and then through an unillustrated color filter, and subsequently, the white light is emitted upward as display light. Thus, in the display unit 1, an image is displayed by a top emission system.

In this case, the second electrode 17 establishes interlayer connection with the connection section 13 in the drive substrate 11A in the peripheral region 1B, and is electrically connected to the wiring layer 126B through the connection section 13. In the top emission system, a transparent conductive film having light transparency is used as the second electrode 17.

Figure 12:
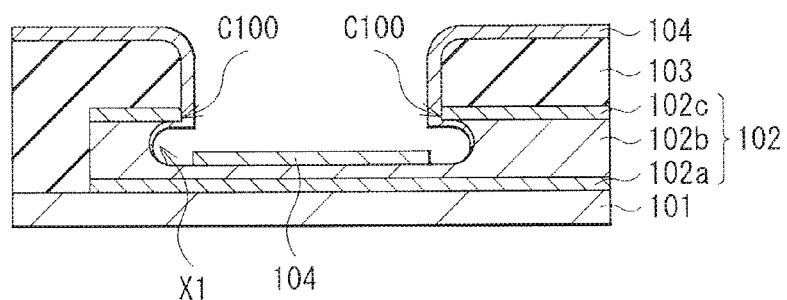
FIG. 12 is a sectional view illustrating a wiring connection portion of a device configuration according to a comparative example.

FIG. 12 illustrates a device configuration of a wiring connection portion according to a comparative example. In the comparative example, a connection section 102 is formed on a substrate 101 made of glass or the like, and a second electrode 104 is formed on the connection section 102 with a planarization film 103 in between. The connection section 102 may be a laminated film (including a titanium layer 102a, an aluminum layer 102b, and a molybdenum layer 102c) formed in the same process as a process of forming a gate electrode or a source-drain electrode (for example, a source drain electrode) of a TFT (not illustrated in FIG. 12).

In the connection section 102, favorable electrical connection with the second electrode 104 is allowed to be obtained in the molybdenum layer 102c or the titanium layer 102a, because of the following reason. Since the second electrode 104 is typically formed with use of a PVD method such as a sputtering method, the connection section 102 is easily oxidized by oxygen or oxygen plasma during film formation. Therefore, a metal (herein, the molybdenum layer 102c) exhibiting electrical conductivity even in an oxidized form is used in an outermost portion of the connection section 102.

However, even in a case where such a connection section 102 is used, the molybdenum layer 102c in the outermost portion disappears due to erosion during wet etching processing of another metal film or the like, and the aluminum layer 102b is also considerably eroded. A large dent (X1) is formed in the connection section 102, and the second electrode 104 is likely to be divided. Moreover, in the molybdenum layer 102c that is supposed to be electrically connected to the second electrode 104, only an edge portion thereof is in contact with the second electrode 104 (C100), thereby causing insufficient electrical connection. Further, when a substrate size is increased, or when in-plane uniformity in etching processing is degraded, electrical connection may not be secured. This exerts a large influence on a lighting state of a display.

On the other hand, in this embodiment, since the connection section 13 provided in the drive substrate 11A includes the oxide semiconductor layer 121B, compared to the above-described comparative example (a case where the connection section 102 is made of a metal), the connection section 13 is resistant to damage during processing of another metal film (for example, the metal film 126 or the like). Moreover, in the comparative example, contact resistance may be increased due to erosion and oxidation of the connection section 102, but on the other hand, in the connection section 13 in this embodiment, contact resistance is less likely to be increased due to such erosion and oxidation. Further, since the composition of the second electrode 17 is similar to that of the connection section 13, an increase in contact resistance is allowed to be suppressed in this respect. For example, in a case where IZO and ITZO are used as the second electrode 17 and the oxide semiconductor layer 121B of the connection section 13, respectively, both IZO and ITZO are metal oxides containing zinc; therefore, better electrical connection than that in the comparative example is allowed to be secured. In addition thereto, since the connection section 13 includes the low-resistance region 121B1 in at least a portion on the surface side thereof, contact resistance between the second electrode 17 and the connection section 13 is further reduced.

As described above, in this embodiment, the connection section 13 provided in the drive substrate 11A includes the oxide semiconductor layer 121B; therefore, compared to the case where the connection section is made of a metal, damage in a manufacturing procedure is allowed to be reduced, and an increase in contact resistance is allowed to be suppressed. Moreover, since the connection section 13 includes the low-resistance region 121B1 in at least a portion on the surface side thereof, contact resistance between the second electrode 17 and the connection section 13 is allowed to be reduced. Favorable electrical connection with, for example, an external circuit through the connection section 13 is possible (a stable electrode lead-out configuration is achievable). Therefore, favorable electrical connection is allowed to be secured in, for example, a wiring connection section around the pixel section.

Application Examples

The display unit described in the above-described embodiment is applicable to electronic apparatuses, in any fields, that display an image signal inputted from outside or an image signal produced inside as an image. In particular, the display unit may be suitably applicable to medium to large-sized electronic apparatuses. Some examples of the electronic apparatuses will be described below.

Figure 13:
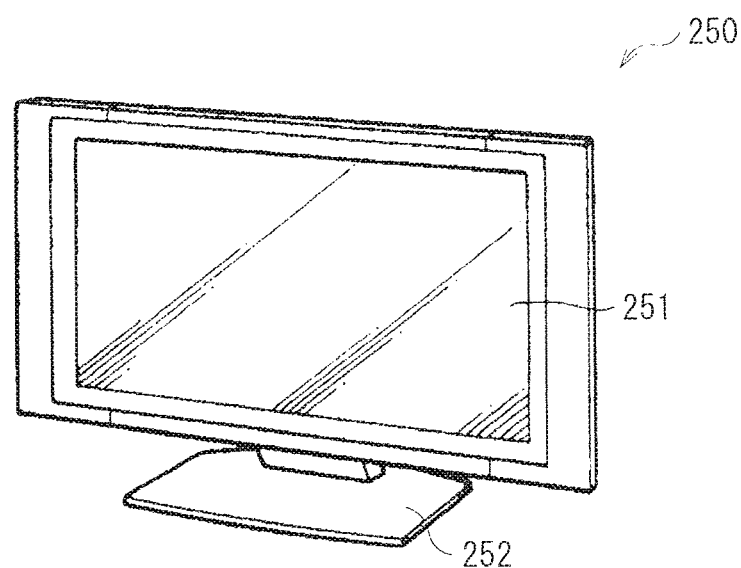
FIG. 13 is a perspective view illustrating a configuration of a television.

FIG. 13 illustrates an appearance of a television 250. The television 250 may include, for example, a main body section 251 and a stand 252. The display unit 1 according to the above-described embodiment is mounted in the main body section 251.

Figure 14:
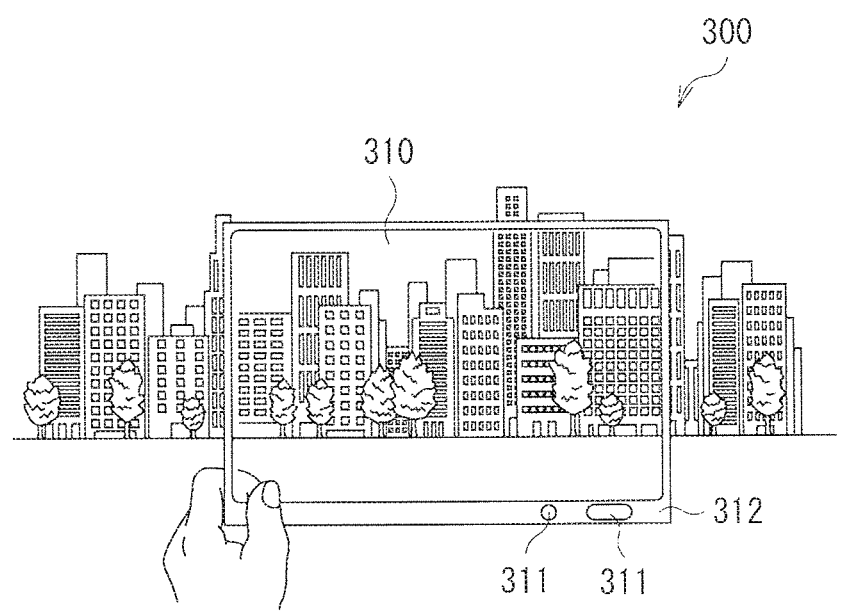
FIG. 14 is a front view illustrating a configuration of a transparent display.

FIG. 14 illustrates an appearance of a transparent display 300. The transparent display 300 may include, for example, a display section 310, an operation section 311, and a housing 312. The display section 310 is configured of the display unit according to the above-described embodiment. The transparent display 300 is allowed to display an image or character information while a background is visible through the display section 310.

Although the present disclosure is described referring to the embodiments and the like, the present disclosure is not limited thereto, and various modifications are possible. Moreover, the material and thickness of each layer are not limited to those described in the above-described embodiments and the like, and each layer may be made of any other material with any other thickness. Further, it is not necessary for the display unit to include all of the above-described layers, or the display unit may further include other layers in addition to the above-described layers.

Furthermore, the effects described in the above-described embodiments and the like are merely examples, and may be other effects, or may further include other effects.

It is to be noted that the present technology may have the following configurations.

(1) A display unit including:
a drive substrate including a thin film transistor;
a pixel section provided on the drive substrate and including a plurality of pixels, each of the pixels including a first electrode, an organic layer including a light-emitting layer, and a second electrode in this order; and
a connection section provided in a peripheral region around the pixel section in the drive substrate and configured to be electrically connected to the second electrode,
in which the connection section includes an oxide semiconductor layer including, in at least a portion on a surface side thereof, a low-resistance region with lower electrical resistance than that in a portion other than the low-resistance region.

(2) The display unit according to (1), in which the thin film transistor includes
a semiconductor layer,
a gate electrode disposed to face the semiconductor layer with a gate insulating film in between, and
a source electrode and a drain electrode configured to be electrically connected to the semiconductor layer, and
the semiconductor layer includes a material same as that of the oxide semiconductor layer of the connection section.

(3) The display unit according to (2), in which the semiconductor layer includes the low-resistance region in each of portions in contact with the source electrode and the drain electrode.

(4) The display unit according to any one of (1) to (3), in which the oxide semiconductor layer is made of a material with etching resistance against an etchant of a metal film formed above the oxide semiconductor layer.

(5) The display unit according to any one of (1) to (4), further including a wiring layer laminated on at least a portion of the connection section and made of a metal.

(6) The display unit according to any one of (1) to (5), in which a metal oxide film made of an oxide of a metal is formed to cover at least a portion not in contact with the second electrode of the connection section.

(7) The display unit according to (6), in which the low-resistance region is formed by contact reaction with the metal of the oxide semiconductor layer and heating treatment.

(8) The display unit according to (6) or (7), in which the metal is aluminum.

(9) The display unit according to any one of (6) to (8), in which the metal oxide film is formed to cover a portion of the thin film transistor.

(10) The display unit according to any one of (1) to (9), in which the second electrode is configured of a transparent conductive film made of an oxide semiconductor.

(11) An electronic apparatus provided with a display unit, the display unit including:
a drive substrate including a thin film transistor;
a pixel section provided on the drive substrate and including a plurality of pixels, each of the pixels including a first electrode, an organic layer including a light-emitting layer, and a second electrode in this order; and
a connection section provided in a peripheral region of the pixel section in the drive substrate and configured to be electrically connected to the second electrode,
in which the connection section includes an oxide semiconductor layer including, in a part on a surface side, a low-resistance region with lower electrical resistance than that in a portion other than the low-resistance region.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit comprising:
a drive substrate including a thin film transistor;
a pixel section provided on the drive substrate and including a plurality of pixels, each of the pixels including a first electrode, an organic layer including a light-emitting layer, and a second electrode in this order; and
a connection section provided in a peripheral region around the pixel section in the drive substrate and configured to be electrically connected to the second electrode,
wherein the connection section includes an oxide semiconductor layer including, in at least a portion on a surface side thereof, a low-resistance region with lower electrical resistance than that in a portion other than the low-resistance region.

2. The display unit according to claim 1, wherein
the thin film transistor includes
a semiconductor layer,
a gate electrode disposed to face the semiconductor layer with a gate insulating film in between, and
a source electrode and a drain electrode configured to be electrically connected to the semiconductor layer, and
the semiconductor layer includes a material same as that of the oxide semiconductor layer of the connection section.

3. The display unit according to claim 2, wherein the semiconductor layer includes the low-resistance region in each of portions in contact with the source electrode and the drain electrode.

4. The display unit according to claim 1 wherein the oxide semiconductor layer is made of a material with etching resistance against an etchant of a metal film formed above the oxide semiconductor layer.

5. The display unit according to claim 1, further comprising a wiring layer laminated on at least a portion of the connection section and made of a metal.

6. The display unit according to claim 1, wherein a metal oxide film made of an oxide of a metal is formed to cover at least a portion not in contact with the second electrode of the connection section.

7. The display unit according to claim 6, wherein the low-resistance region is formed by contact reaction with the metal of the oxide semiconductor layer and heating treatment.

8. The display unit according to claim 6, wherein the metal is aluminum.

9. The display unit according to claim 6, wherein the metal oxide film is formed to cover a portion of the thin film transistor.

10. The display unit according to claim 1 wherein the second electrode is configured of a transparent conductive film made of an oxide semiconductor.

11. An electronic apparatus provided with a display unit, the display unit comprising:
a drive substrate including a thin film transistor;
a pixel section provided on the drive substrate and including a plurality of pixels, each of the pixels including a first electrode, an organic layer including a light-emitting layer, and a second electrode in this order; and
a connection section provided in a peripheral region around the pixel section in the drive substrate and configured to be electrically connected to the second electrode,
wherein the connection section includes an oxide semiconductor layer including, in at least a portion on a surface side thereof, a low-resistance region with lower electrical resistance than that in a portion other than the low-resistance region.

* * * * *